United States Patent
Chang et al.

(10) Patent No.: US 9,764,948 B2
(45) Date of Patent: Sep. 19, 2017

(54) MEMS CAP WITH MULTI PRESSURE

(71) Applicant: Taiwan Semiconductor Manufacturing Company, Ltd., Hsin-Chu (TW)

(72) Inventors: Kai-Fung Chang, Taipei (TW); Len-Yi Leu, Hsin-Chu (TW); Lien-Yao Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/003,283

(22) Filed: Jan. 21, 2016

(65) Prior Publication Data

US 2017/0210619 A1    Jul. 27, 2017

(51) Int. Cl.
*B81C 1/00* (2006.01)
*B81B 3/00* (2006.01)

(52) U.S. Cl.
CPC ........ *B81C 1/00269* (2013.01); *B81B 3/0021* (2013.01); *B81B 2207/09* (2013.01); *B81C 2203/0118* (2013.01)

(58) Field of Classification Search
CPC ......... B81C 1/00269; B81C 2203/0118; B81B 3/0021; B81B 2207/09
See application file for complete search history.

(56) References Cited

U.S. PATENT DOCUMENTS

| | | | |
|---|---|---|---|
| 8,802,473 | B1 | 8/2014 | Chu et al. |
| 9,040,334 | B2 | 5/2015 | Chu et al. |
| 9,187,317 | B2 | 11/2015 | Cheng et al. |
| 2008/0081427 | A1* | 4/2008 | Chen .................. G02B 26/0833 438/381 |
| 2014/0264653 | A1 | 9/2014 | Cheng et al. |
| 2014/0264662 | A1* | 9/2014 | Cheng ................ B81C 1/00309 257/419 |

OTHER PUBLICATIONS

Peterson et al., "Surface micromachined structures fabricated with silicon fusion bonding", Solid-State Sensors and Actuators, 1991. Digest of Technical Papers, TRANSDUCERS '91., 1991 International Conference on, Jun. 24-27, 1991, pp. 397-399.*
Saint-Patrice et al., "Low Temperature Sealing Process for Vacuum MEMS Encapsulation", Electronic Components and Technology Conference (ECTC), 2012 IEEE 62nd, May 29-Jun. 1, 2012, pp. 97-101.*
Passemard, Gerard et al., "Study of Fluorine Stability in Fluoro-Silicate Glass and Effects on Dielectric Properties," Microelectronic Engineering, 1997, pp. 335-342.

* cited by examiner

*Primary Examiner* — Tom Thomas
*Assistant Examiner* — Vincent Wall
(74) *Attorney, Agent, or Firm* — Slater Matsil, LLP

(57) ABSTRACT

Micro-electromechanical (MEMS) devices and methods of forming are provided. An outgas layer is deposited on a surface of a cap wafer. The cap wafer is bonded to a substrate in a manner that forms a first sealed cavity including a first movable element and a second sealed cavity including a second movable element. The out gas layer is annealed to release gas from the out gas layer into the second sealed cavity and increase a pressure of the second sealed cavity so that the second sealed cavity has a higher pressure than the first sealed cavity after the annealing.

20 Claims, 29 Drawing Sheets

MEMS CAP WITH MULTI PRESSURE

BACKGROUND

Micro-electromechanical systems ("MEMS") are becoming increasingly popular, particularly as such devices are miniaturized and are integrated into integrated circuit manufacturing processes. MEMS devices introduce their own unique requirements into the integration process, however. Electrically interconnecting MEMS devices is an area of unique challenges. In particular, integrating MEMS devices with other MEMS devices into the same integrated circuit manufacturing process has posed challenges.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION

Figure 1:
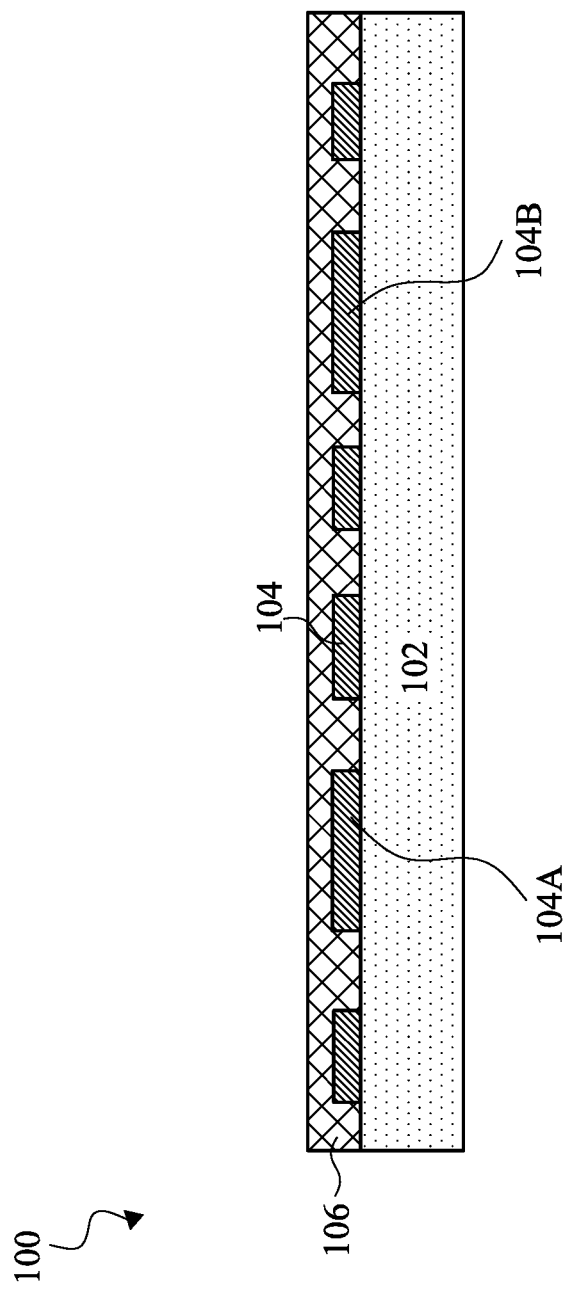
FIGS. 1 through 28 are cross-sectional views of intermediate stages of manufacture of a MEMS device in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1 through 28 illustrate cross-sectional views of intermediate stages of manufacture of MEMS chip 2800 (see FIGS. 27 through 28) having first device 2802 disposed in first sealed cavity 2806 and second device 2804 disposed in second sealed cavity 2808, where first sealed cavity 2806 has a different pressure than second sealed cavity 2808. First device 2802 and second device 2804 are manufactured using the same integrated circuit (IC) chip. Therefore, various embodiments illustrated by FIGS. 1 through 29 allow for the smooth integration of manufacturing the first device and the second device on a single chip.

As shown in FIG. 1, structure 100 includes substrate 102. Substrate 102 may be formed of silicon, or other materials such as silicon germanium, silicon carbide, combinations thereof, or the like. Substrate 102 may be formed of low resistive silicon. In some embodiments, substrate 102 may be a silicon-on-insulator (SOI) substrate. SOI substrate may comprise a layer of semiconductor material (e.g., silicon, germanium, and the like) formed over an insulator layer (e.g., buried oxide), which is formed in a silicon substrate. In addition, other substrates that may be used include multi-layered substrates, gradient substrates, hybrid orientation substrates, and the like.

A layer of metallization 104 is formed over substrate 102. Metallization layer 104 may comprise electrical components of the MEMS devices. For example, metallization layer 104 may include one or more sensors for one or more MEMS devices, such as sensor 104A for a gyroscope and sensor 104B for an accelerometer. Metallization layer 104 may also include electrical connections between components of the MEMS devices and to external devices and components.

Metallization layer 104 may be formed using any suitable methods. For example, in some embodiments, the formation of metallization layer 104 includes forming a dielectric layer 106 on the substrate 102. In some embodiments, dielectric layer 106 is formed of a polymer, which may be a photo-sensitive material such as polybenzoxazole (PBO), polyimide, benzocyclobutene (BCB), combinations thereof, or the like, that may be patterned using lithography. In other embodiments, dielectric layer 106 is formed of a nitride such as silicon nitride, an oxide such as silicon oxide, Phospho-Silicate Glass (PSG), BoroSilicate Glass (BSG), Boron-doped PhosphoSilicate Glass (BPSG), combinations or alloys thereof, or the like. Dielectric layer 106 may be formed by spin coating, lamination, chemical vapor deposition (CVD), the like, or a combination thereof. Dielectric layer 106 is then patterned to form openings in which metallization layer 104 will be formed. In embodiments in which dielectric layer 106 is formed of a photo-sensitive material, the patterning may be performed by exposing dielectric layer 106 in accordance with a desired pattern and developed to remove the unwanted material, thereby exposing the desired locations of metallization. Other methods, such as using a patterned mask and etching, may also be used to pattern dielectric layer 106.

A seed layer (not shown) is formed over dielectric layer 106 and in the openings formed in dielectric layer 106. In some embodiments, the seed layer is a metal layer, which may be a single layer or a composite layer comprising a plurality of sub-layers formed of different materials. The seed layer may be made of copper, titanium, nickel, gold, or combinations or alloys thereof, or the like. In some embodiments, the seed layer comprises a titanium layer and a copper layer over the titanium layer. The seed layer may be formed using, for example, PVD, CVD, atomic layer deposition (ALD), a combination thereof, or the like. A conductive material is formed in the openings in dielectric layer 106. The conductive material may be formed by plating, such as electroplating or electroless plating, or the like. The conductive material may comprise a metal, like copper, titanium, tungsten, aluminum, or the like, or alloys or combinations thereof. Then, excess conductive material that extends beyond the openings in dielectric layer 106 are removed. The conductive material may be removed by an acceptable process, such as a grinding process or a chemical mechanical polishing (CMP) process, or by using an acceptable etching process, such as by wet or dry etching. The remaining portions of the seed layer and conductive material form the electrical connections of the metallization layer 104.

Figure 2:
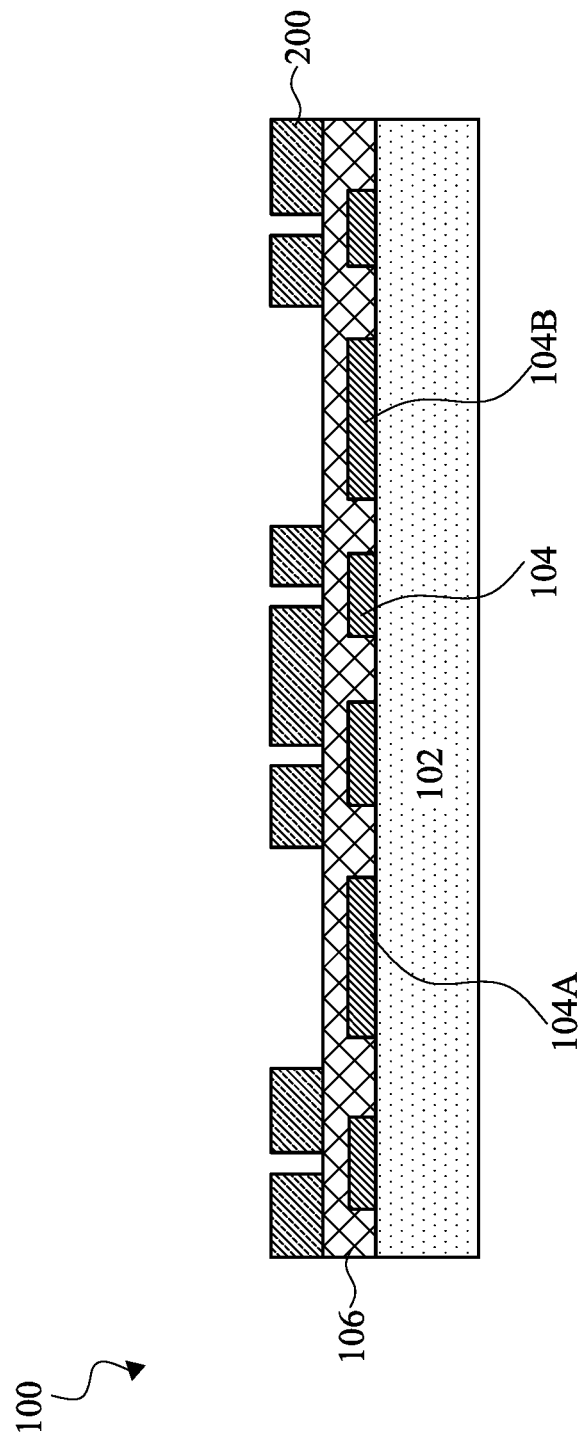

Next, referring to FIG. 2, photoresist layer 200 is deposited over dielectric layer 106 and patterned. The patterning of photoresist layer 200 exposes the areas of dielectric layer 106 above metallization layer 104 where MEMS cavities will be formed. As will be explained in greater detail below, first device 2802 will be formed in a first MEMS cavity, and second device 2804 will be formed in a second MEMS cavity. (see FIGS. 28-29). Photoresist layer 200 is patterned to expose the areas of dielectric layer 106 over and surrounding the sensors 104A and 104B where part of the first and second cavities will be created. Photoresist layer 200 is also patterned to expose the areas of dielectric layer 106 where through vias will be located. As will be discussed in greater detail below, substrate 800 will be bonded to dielectric layer 106 on an opposite side of dielectric layer 106 from substrate 102 (see FIG. 5). The through vias will provide an electrical connection between metallization layer 104 and contacts on the other side of the substrate 800.

Figure 3:
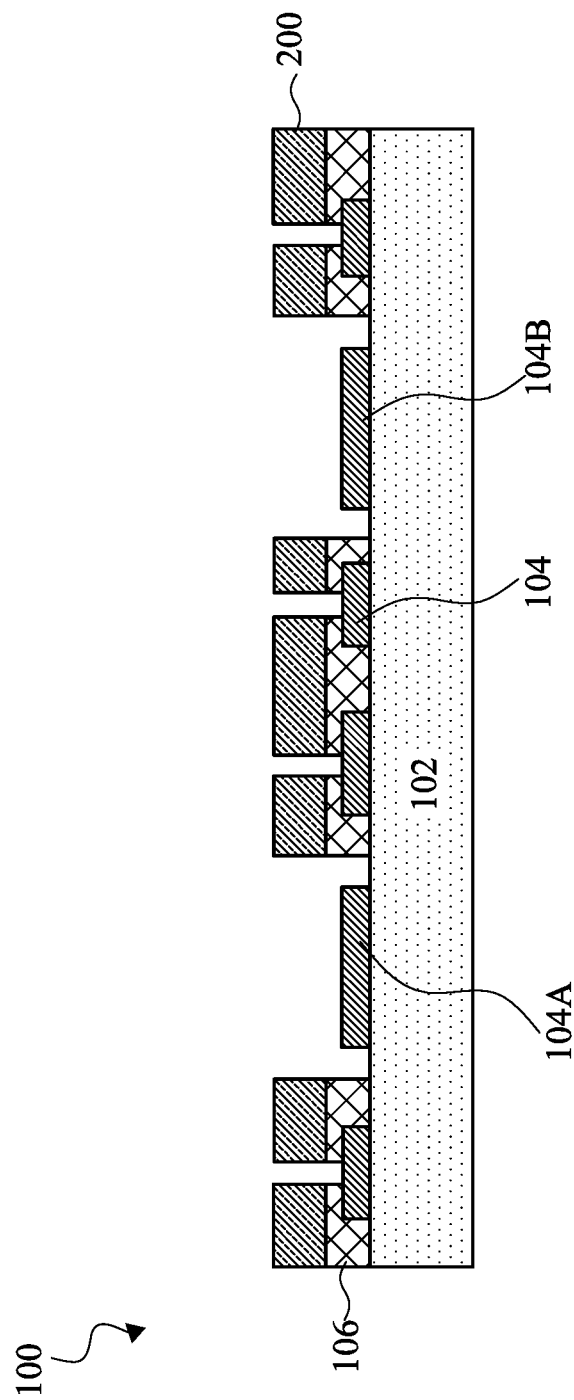
Figure 4:
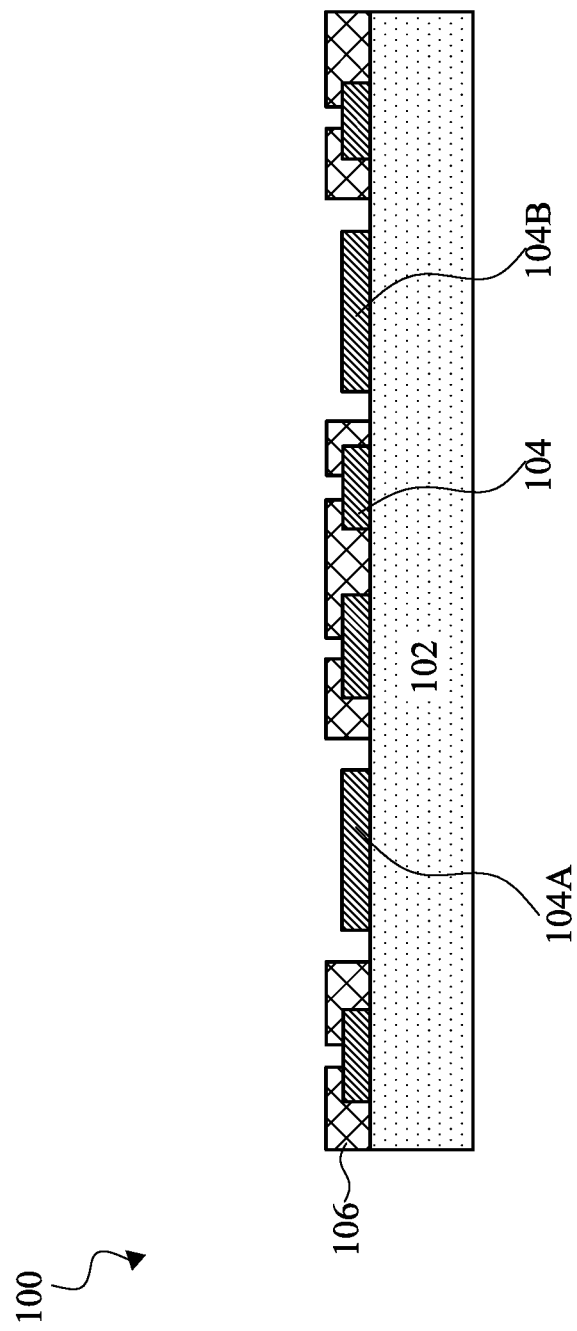

After photoresist layer 200 is patterned, dielectric layer 106 is etched. Any acceptable etching process may be used, such as wet or dry etching. The etched structure is depicted in FIG. 3. Photoresist layer 200 is then removed. Photoresist layer 200 may be removed through a process such as dissolving in chemical solution, plasma ashing or other means, whereby the temperature of photoresist layer 200 is increased until photoresist layer 200 decomposes and may be removed. After photoresist layer 200 is removed, the resulting structure is depicted in FIG. 4.

Figure 5:
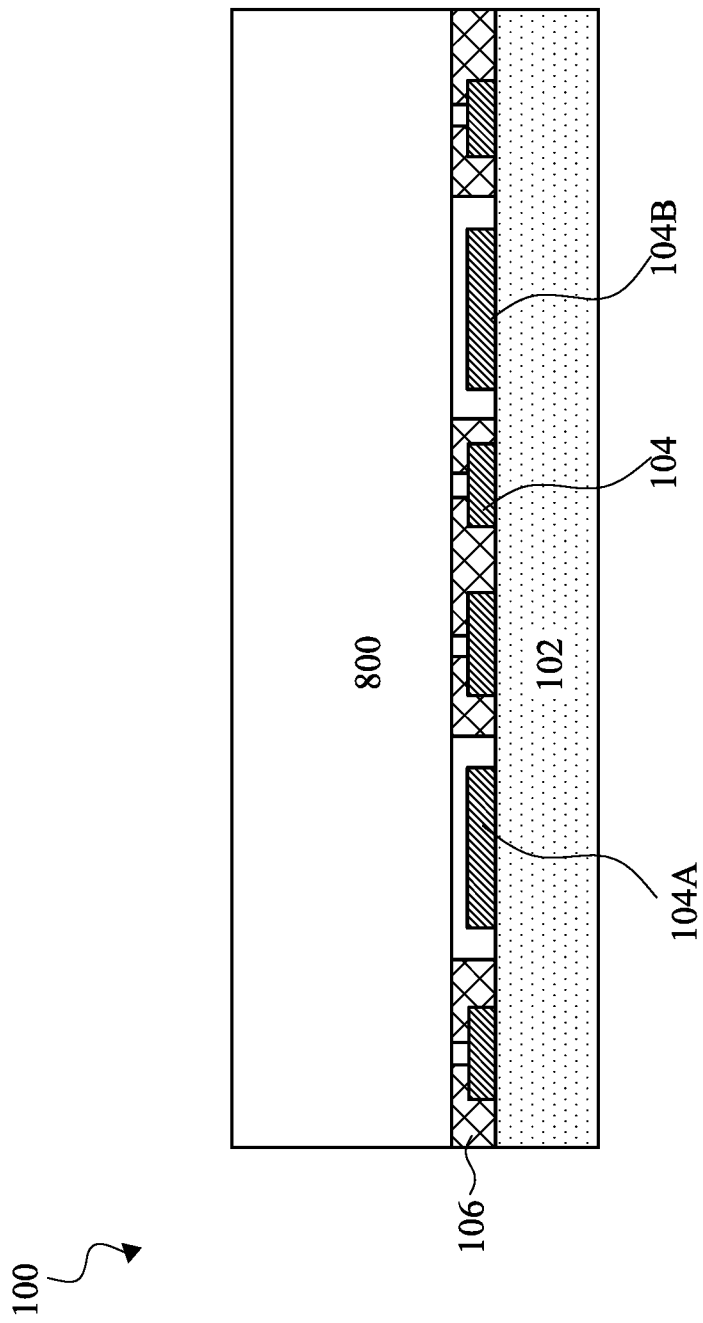

Next, referring to FIG. 5, substrate 800 is bonded to structure 100. Substrate 800 is bonded to a surface of dielectric layer 106 that is opposite to the interface of dielectric layer 106 and substrate 102. Substrate 800 may be formed of silicon, or other materials such as silicon germanium, silicon carbide, combinations thereof, or the like. Substrate 800 may be formed of low resistive silicon. In some embodiments, substrate 800 may be a silicon-on-insulator (SOI) substrate. An SOI substrate may comprise a layer of semiconductor material (e.g., silicon, germanium, and the like) formed over an insulator layer (e.g., buried oxide), which is formed in a silicon substrate. In addition, other substrates that may be used include multi-layered substrates, gradient substrates, hybrid orientation substrates, and the like.

Substrate 800 may be bonded to the structure 100 using any suitable technique such as fusion bonding, anodic bonding, eutectic bonding, glass frit bonding, and the like. For example, in various embodiments, substrate 800 may be fusion bonded to structure 100 using a thin polysilicon layer (not shown) as a bonding interface. In some embodiments, the bonding interface may be formed by a deposition process. Once formed, substrate 800 is aligned with structure 100 and the two are contacted together to initiate a bonding of the substrate 800 to structure 100. Once the bonding has been initiated by contacting substrate 800 to structure 100, the bonding process may be strengthened by heating substrate 800 and structure 100 to a temperature. In some embodiments, the temperature may be from 100 degrees to 600 degrees. In some embodiments, a bonding force is applied to substrate 800 and structure 100 to strengthen the bonding process. In some embodiments, a force from 1 KN to 50 KN may be applied.

The bonding of substrate 800 to structure 100 creates cavities which sensors for MEMS devices are disposed. For example, after the bonding, gyroscope sensor 104A is disposed in a sealed cavity, as is accelerometer sensor 104B.

Figure 6:
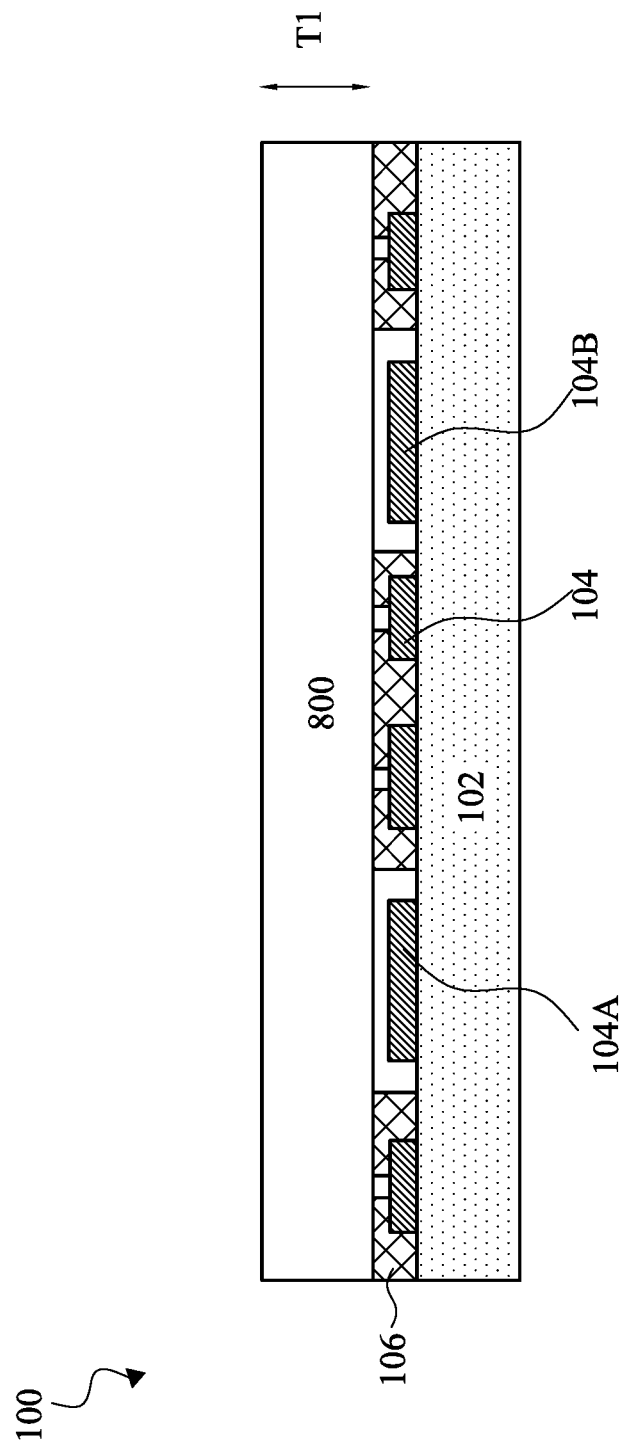

Referring to FIG. 6, substrate 800 may be thinned to a desired thickness T1. The thinning process may include grinding and CMP processes, etch back processes, or other acceptable processes performed on a surface of substrate 800. As a result of this thinning process, substrate 800 may have a thickness T1 from about 10 µm to about 50 µm, such as about 30 µm.

Figure 7:
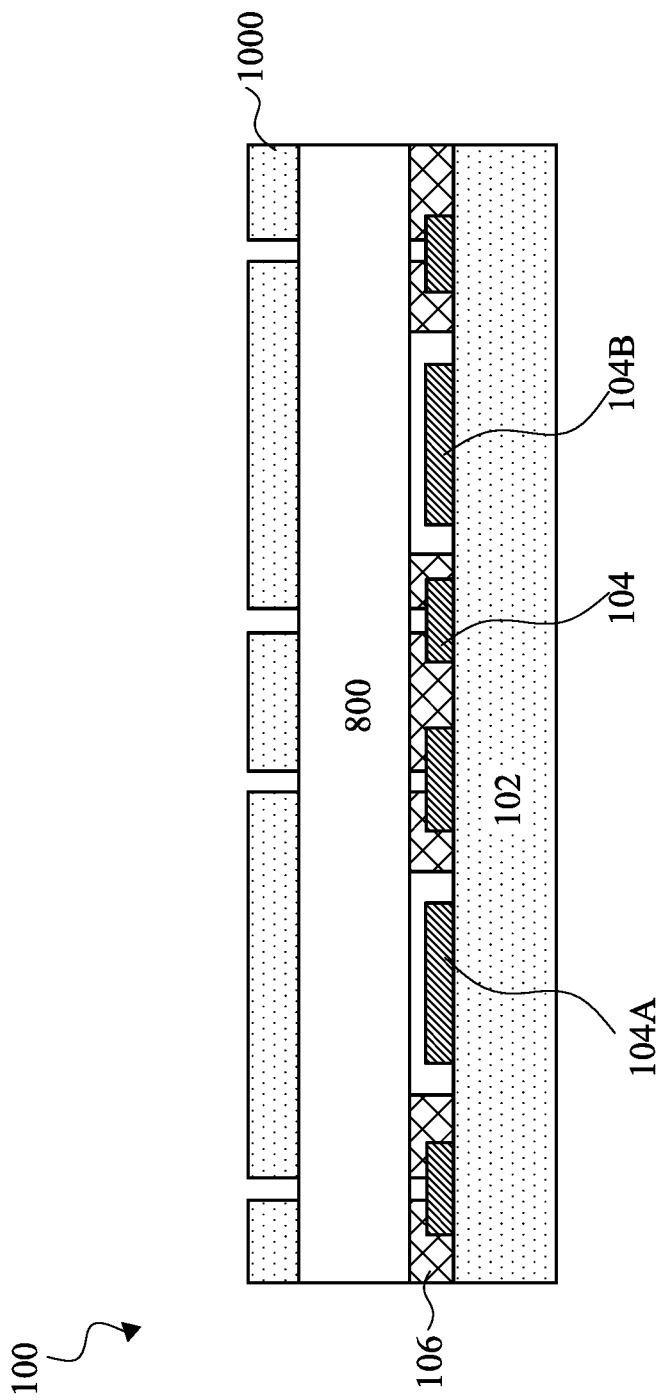

Next, as shown in FIG. 7, a photoresist layer 1000 is deposited and patterned. Openings in photoresist layer 1000 expose areas of substrate 800 where through vias will be formed. The through vias provide electrical connections from metallization layer 104 to contacts that will subsequently be formed on a top surface of substrate 800.

Figure 8:
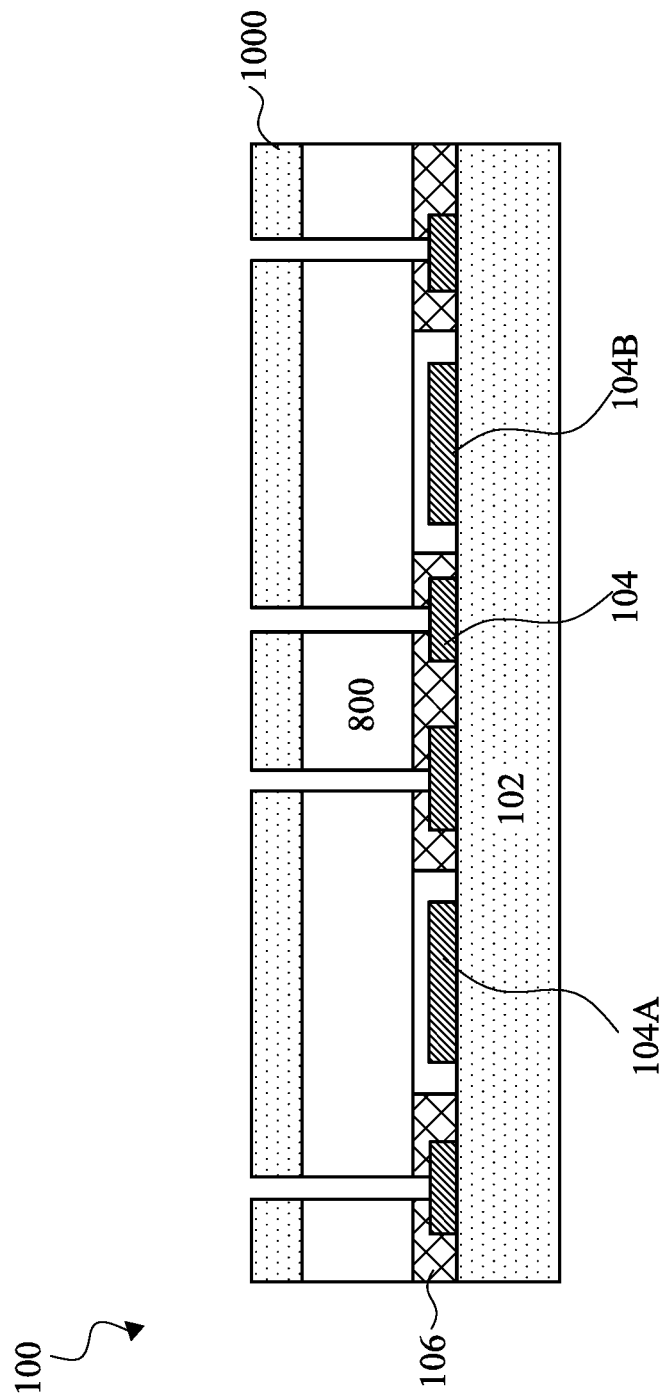
Figure 11:
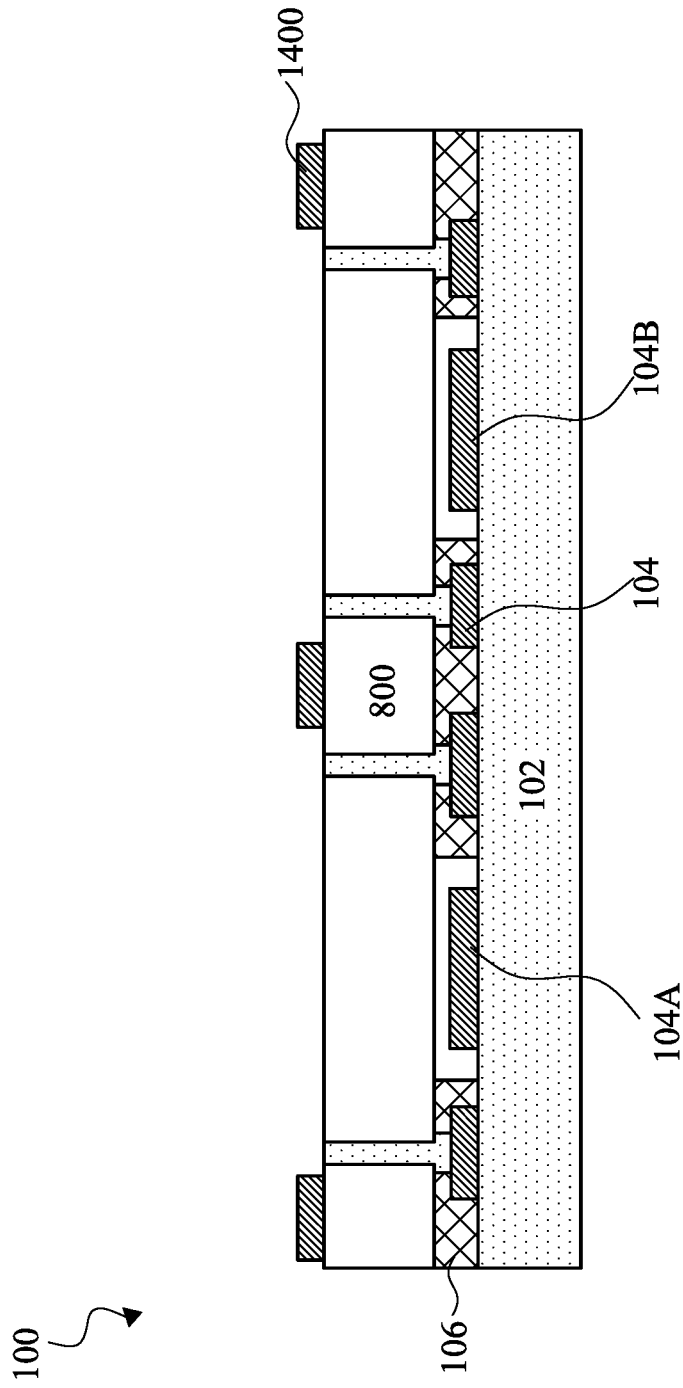

Next, referring to FIG. 8, substrate 800 is etched through the openings in photoresist layer 1000. Any acceptable etching process may be used, such as wet or dry etching. As shown in FIG. 11, the etching creates openings in substrate 800 that penetrate through substrate 800. The openings in substrate 800 are positioned over the through via openings previously created in dielectric layer 106. Photoresist layer 1000 is then removed. Photoresist layer 1000 may be removed through a process such as dissolving in chemical solution, plasma ashing or other means, whereby the temperature of photoresist layer 1000 is increased until the photoresist layer 1000 decomposes and may be removed.

Figure 9:
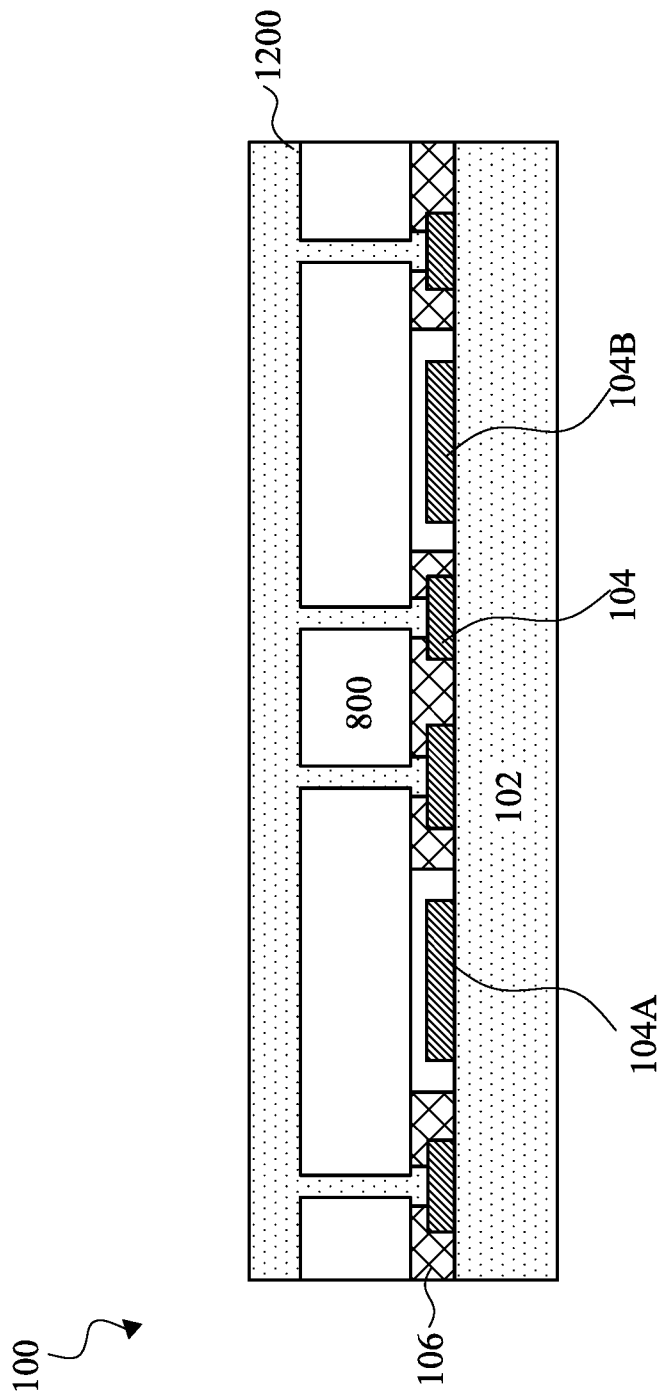

Referring to FIG. 9, through vias 1200 are formed in the openings. The through vias 1200 may be formed, for example, by forming a conductive seed layer (not shown) over the substrate 800. In some embodiments, the seed layer is a metal layer, which may be a single layer or a composite layer comprising a plurality of sub-layers formed of different materials. The seed layer may be made of copper, titanium, nickel, gold, or alloys or combinations thereof, or the like. In some embodiments, the seed layer comprises a titanium layer and a copper layer over the titanium layer. The seed layer may be formed using, for example, PVD, CVD, ALD, a combination thereof, or the like.

Next, the openings may be filled with a conductive material using, for example, an electroless plating process or an electrochemical plating process, thereby creating through vias 1200. Through vias 1200 may comprise copper, aluminum, tungsten, nickel, solder, or alloys or combinations thereof. The top-view shapes of through vias 1200 may be rectangles, squares, circles, or the like.

Figure 10:
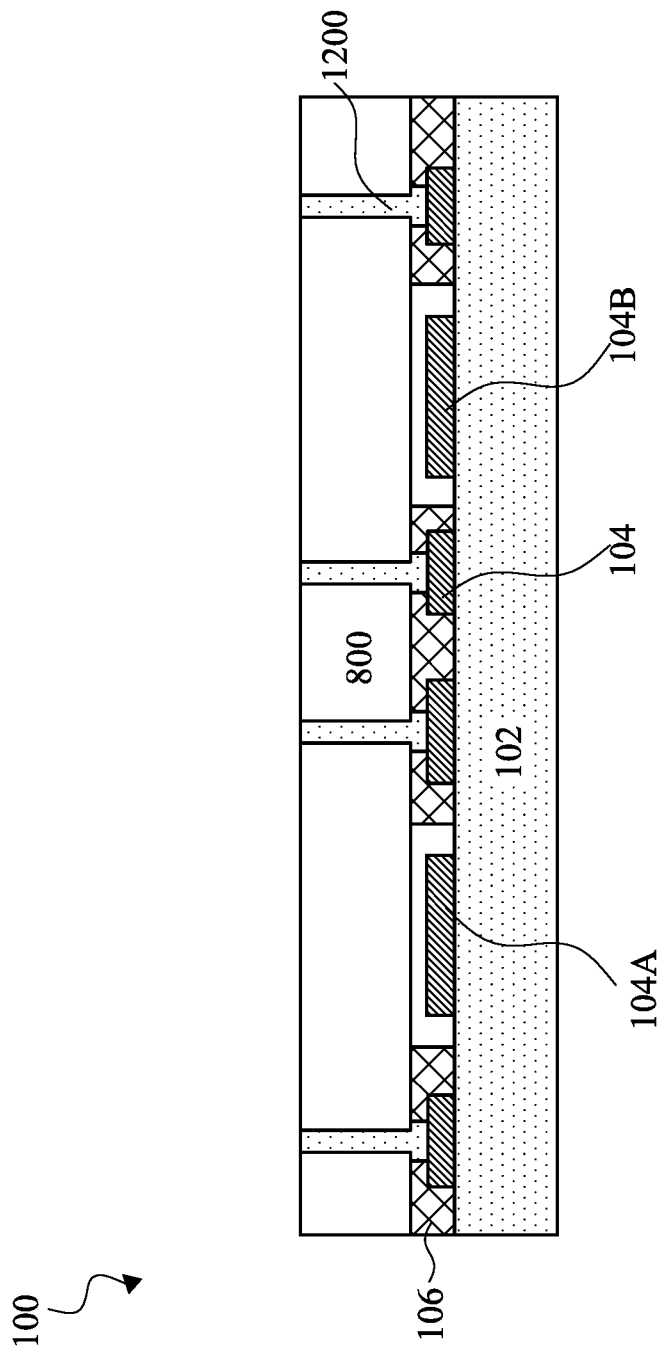

Next, referring to FIG. 10, an etching process, a CMP process, or a grinding process may be performed to remove the exposed portions of the seed layer overlying the substrate 800 and any excess conductive material overlying through vias 1200. Any suitable etching or grinding process may be used. The resulting structure is depicted in FIG. 10.

In some embodiments, when the seed layer used to form the through vias is formed of a material similar to or the same as the through vias 1200, the seed layer may be merged with the through vias 1200 with no distinguishable interface between. In some embodiments, there exist distinguishable interfaces between the seed layer and the through vias 1200.

Next, referring to FIG. 11, contacts 1400 are formed over substrate 800. Contacts 1400 may be formed of aluminum copper (AlCu) and are used for eutectic bonding in subsequent process steps. In some embodiments, any conductive material suitable for eutectic bonding such as Ge, Au, combinations or alloys thereof, or the like may be used.

Any suitable method of forming contacts 1400 may be used. In some embodiments, a seed layer (not shown) may be deposited over substrate 800. In some embodiments, the seed layer is a metal layer, which may be a single layer or a composite layer comprising a plurality of sub-layers formed of different materials. The seed layer may be made of copper, titanium, nickel, gold, or a combinations or alloys thereof, or the like. In some embodiments, the seed layer comprises a titanium layer and a copper layer over the titanium layer. The seed layer may be formed using, for example, PVD, CVD, atomic layer deposition (ALD), a combination thereof, or the like.

A photoresist layer may be subsequently deposited and patterned, where openings in the photoresist layer expose the desired positions of contacts 1400. The openings may be filled with a conductive material using, for example, an electroless plating process or an electrochemical plating process, thereby creating contacts 1400. The top-view shapes of contacts 1400 may be rectangles, squares, circles, or the like. Next, an etch step, a grinding step, or a CMP step may be performed to remove any excess conductive material overlying the contacts 1400. Any suitable etching or grinding process may be used. The photoresist layer may be removed. The photoresist layer may be removed through a process such as dissolving in chemical solution, plasma ashing or other means, whereby the temperature of the photoresist resist layer is increased until the photoresist layer decomposes and may be removed. Another photoresist mask may be deposited and patterned, where openings in the photoresist layer expose the portions of the seed layer that do not underlie a contact 1400. The exposed portions of the seed layer may be etched, and the photoresist layer may be removed, for example using the steps described above, leaving the structure depicted in FIG. 11. Other embodiments are possible.

Figure 12:
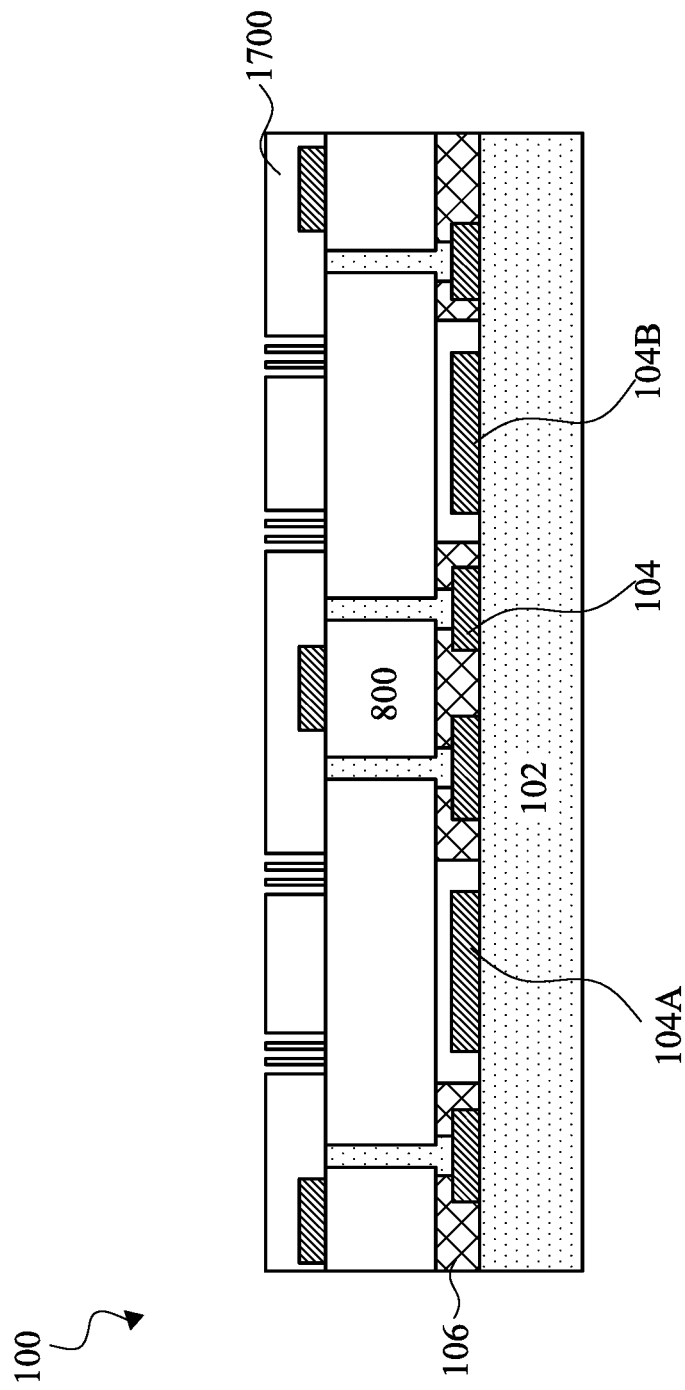
Figure 13:
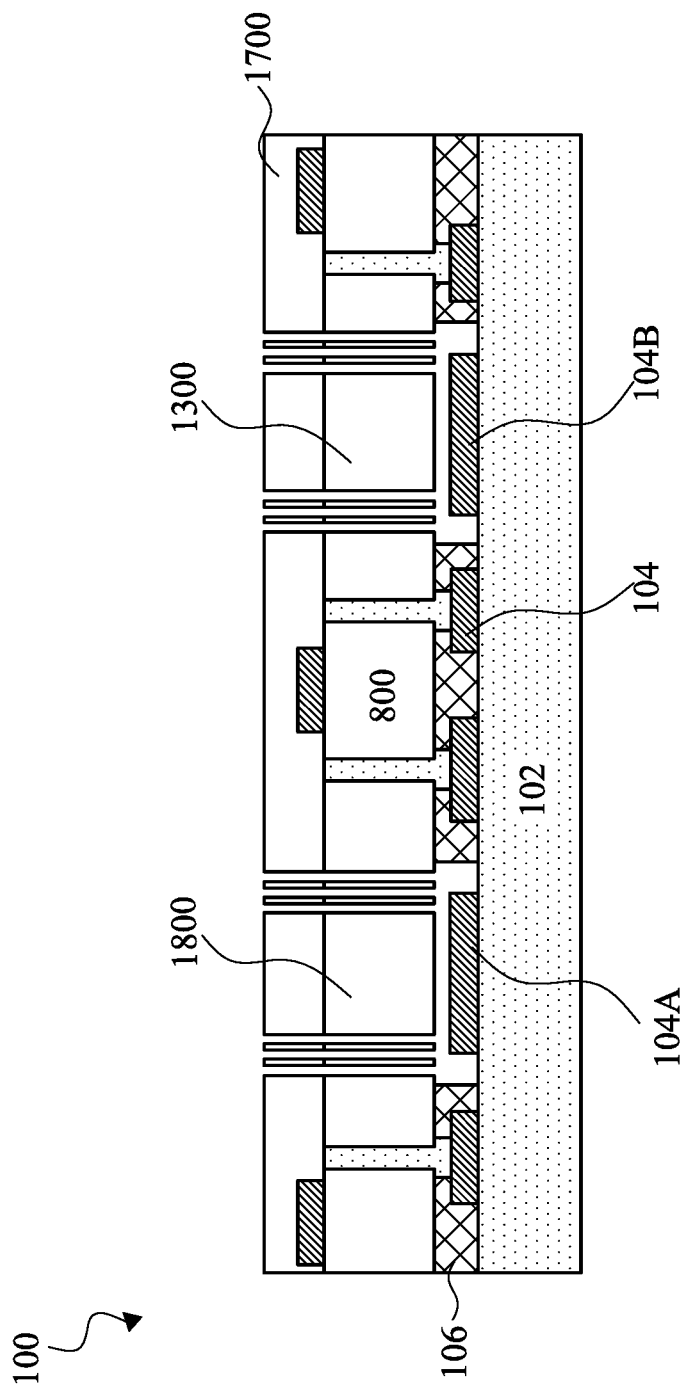
Figure 28:
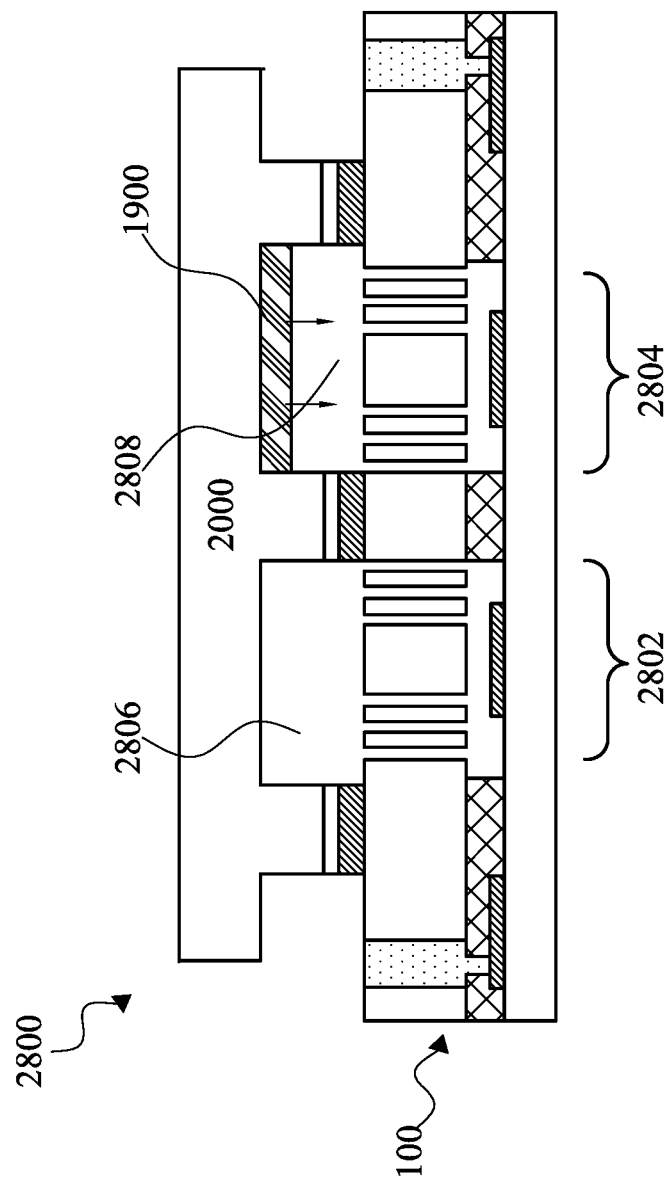

Next, referring to FIG. 12, photoresist layer 1700 is deposited over substrate 800 and patterned. After being patterned, openings in photoresist layer 1700 expose areas of substrate 800 over and around sensor 104A and sensor 104B. Next, an etching process is performed on substrate 800 through the openings in photoresist layer 1700. Any acceptable etching process may be used, such as wet or dry etching. The etched structure is shown in FIG. 13. The etching creates movable mass 1800 and movable mass 1300. Movable mass 1300 and movable mass 1800 are respectively attached to other areas substrate 800, for example using springs (not shown) disposed between each of movable mass 1300 and movable mass 1800 and other areas of substrate 800. The springs attach movable mass 1300 and movable mass 1800 to the overall structure while still allowing movable mass 1300 and movable mass 1800 to move. As shown in FIG. 28, upon completion of the MEMS chip 2800, movable mass 1800 may work in conjunction with sensor 104A to provide a MEMS gyroscope. Similarly, movable mass 1300 may work in conjunction with sensor 104B to provide a MEMS accelerometer.

Figure 14:
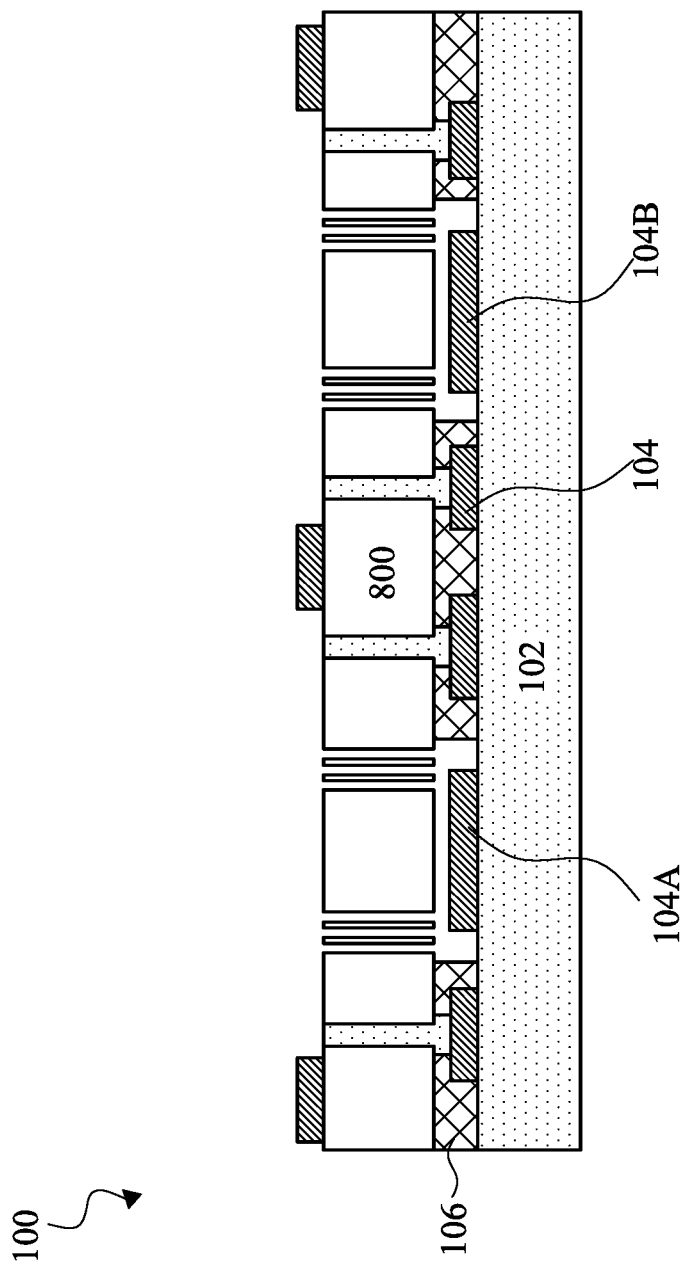
Figure 15:
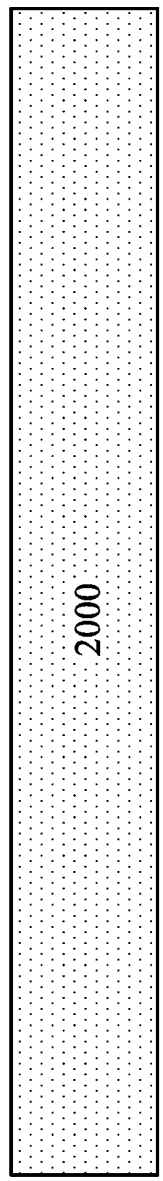

Next, photoresist layer 1700 is removed. The photoresist layer 1700 may be removed through a process such as dissolving in chemical solution, plasma ashing or other means, whereby the temperature of photoresist layer 1700 is increased until photoresist layer 1700 decomposes and may be removed. The resulting structure is depicted in FIG. 14.

Next, a cap wafer 2000 will be bonded to the structure 100. FIGS. 15-26 illustrate various intermediary steps of manufacture of a cap wafer 2000 for inclusion in a completed MEMS chip 2800. Cap wafer 2000, depicted in FIG. 15, may or may not be a semiconductor wafer (e.g., a CMOS wafer), which may or may not have electrical circuits (not shown). In particular cap wafer 2000 may include various active devices such as transistors, capacitors, resistors, diodes, photodiodes, fuses and the like. The electrical circuits may be interconnected to perform one or more functions suitable for a particular application, which may or may not be related to MEMS chip 2800.

Figure 16:
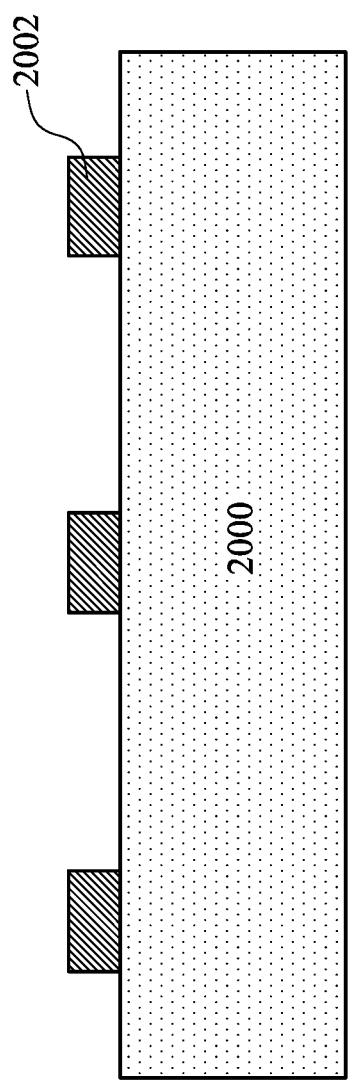
Figure 17:
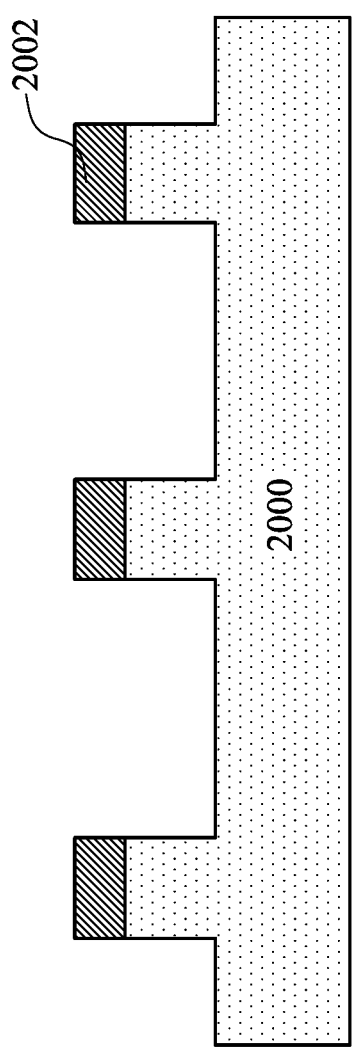
Figure 18:
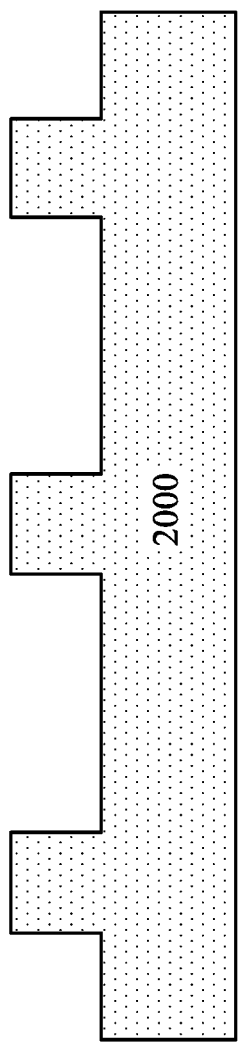

Next, a surface of cap wafer 2000 is patterned to create recesses. As will be discussed in greater detail below, when cap wafer 2000 is bonded to structure 100, the recesses of cap wafer 2000 will help to define first sealed cavity 2806 and second sealed cavity 2808. Referring to FIG. 16, photoresist layer 2002 is deposited over cap wafer 2000 and patterned, where openings in the photoresist layer expose regions of cap wafer 2000 to be etched. An etching may be performed using any suitable etching process, such as wet or dry etching. Cap wafer 2000, after being etched, is depicted in FIG. 17. Photoresist layer 2002 may then be removed, leaving the cap wafer 2000 shown in FIG. 18. Photoresist layer 2002 may be removed through a process such as dissolving in chemical solution, plasma ashing or other means, whereby the temperature of photoresist layer 2002 is increased until photoresist layer 2002 decomposes and may be removed.

Figure 19:
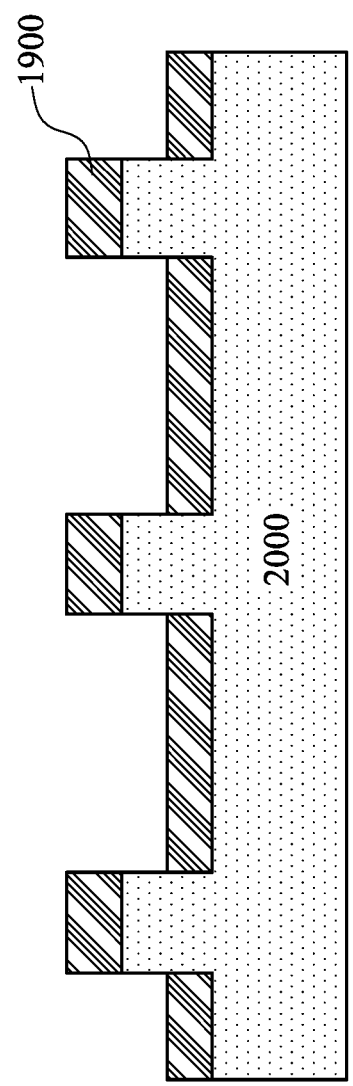

Next, referring to FIG. 19, out gas layer 1900 is deposited over cap wafer 2000. As will be explained in further detail below, the cap wafer 2000 will be processed in a manner that, after cap wafer 2000 is bonded to the structure 100, out gas layer 1900 is confined to second sealed cavity 2808 containing accelerometer 2804. (see FIGS. 27-29). MEMS chip 2800 will then be annealed, which will release gas from the out gas layer 1900 into the cavity, thereby increasing the pressure of the cavity 2808. As such, MEMS chip 2800 may comprise two sealed cavities that are formed during the same bonding process (see FIG. 27), with the two sealed cavities having different pressures inside the cavities.

Out gas layer 1900 may be formed by spin coating, lamination, CVD, the like, or a combination thereof. Out gas layer 1900 may comprise any suitable material suitable for out gassing. In some embodiments, out gas layer 1900 comprises fluorosilicate glass (FSG). In some embodiments, the composition of the FSG may be dependent upon the desired pressure level of the cavity of the completed MEMS device. For example, increasing the amount of fluorine in FSG may increase the volume of gas that is released by the out gas layer 1900 into the MEMS cavity, which may in turn increase the pressure of the cavity. Therefore, if a higher pressure is preferred in a MEMS cavity, the amount of fluorine in out gas layer 1900 may be increased. On the other hand, if a relatively lower pressure is preferable, the amount of fluorine in out gas layer 1900 may be decreased. The relationship between fluorine and out gassing of FSG is described in Passemard et al, *Study of Fluorine Stability in Fluoro-Silicate Glass And Effects On Dielectric Properties*, Microelectronic Engineering 33 (1997) 335-342, which is hereby incorporated by reference.

Figure 20:
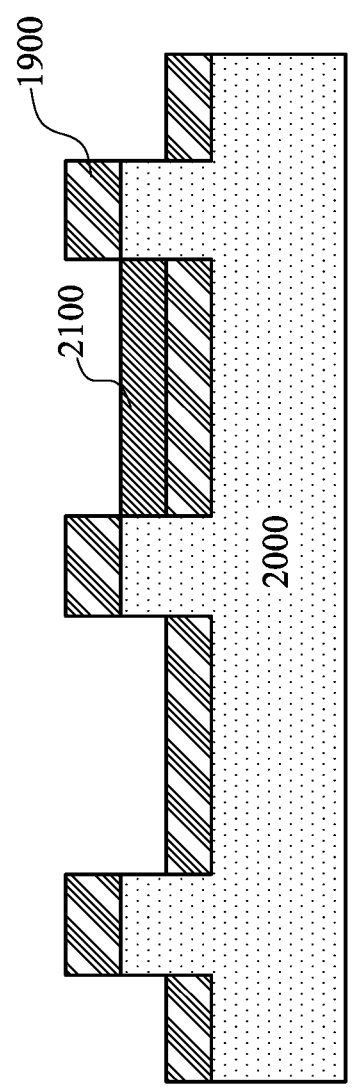
Figure 21:
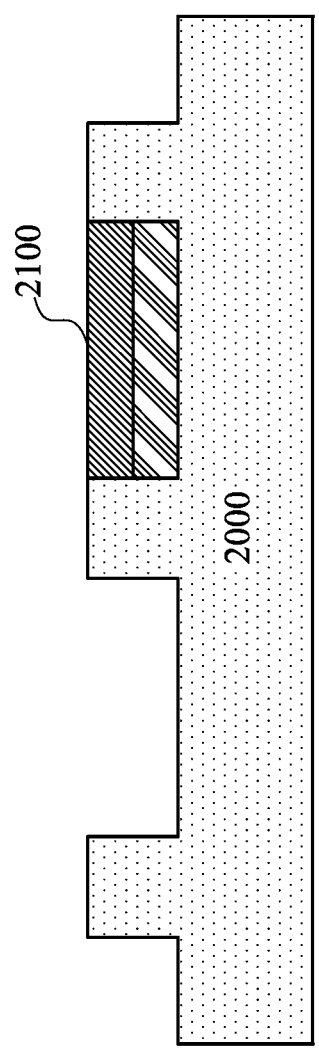
Figure 22:
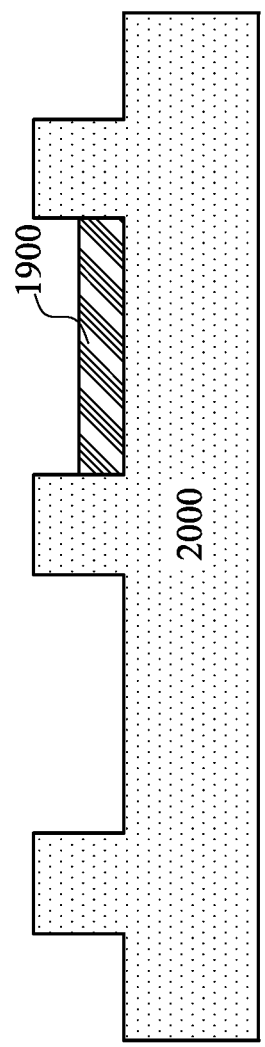

Next, referring to FIG. 20, photoresist layer 2100 is deposited and patterned, where openings in photoresist layer 2100 expose areas of out gas layer 1900 to be removed. Photoresist layer 2100 covers the out gas layer 1900 over the area that will be proximate to cavity 2808 after cap wafer 2000 is bonded to structure 100. (see FIGS. 27-29). Next, out gas layer 1900 is etched through photoresist layer 2100, leaving cap wafer 2000 as shown in FIG. 21. Any suitable etching method may be used, such as wet or dry etching. The photoresist layer 2100 is then removed. The photoresist layer 2100 may be removed through a process such as dissolving in chemical solution, plasma ashing or other means, whereby the temperature of photoresist layer 2100 is increased until photoresist layer 2100 decomposes and may be removed. The resulting cap wafer 2000 is depicted in FIG. 22. As can be seen from FIG. 22, out gas layer 1900 is disposed within a recess of a cavity of cap wafer 2000. As such, when cap wafer 2000 is bonded to structure 100, out gas layer 1900 will be confined to second sealed cavity 2808. (See FIGS. 28-29).

Figure 23:
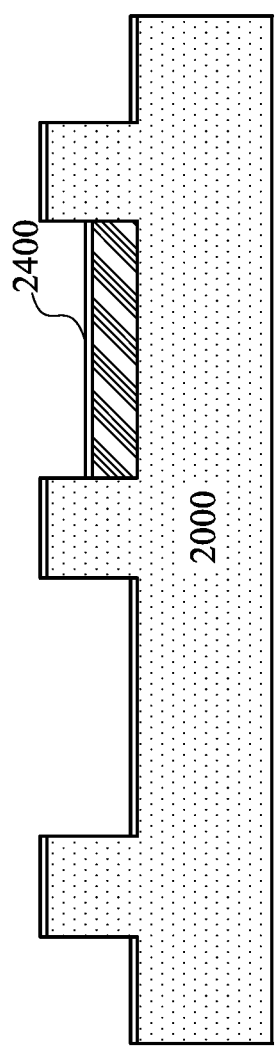

Next, referring to FIG. 23, bonding material layer 2400 (alternatively referred to as bonds 2400) are formed over a top surface of cap wafer 2000. Bonding material layers 2400 may be blanket deposited and patterned using for example PVD and photolithography/etching. Bonding material layer 2400 may be made of a layer of an aluminum copper under a layer of germanium although other metallic materials such as gold may also be used. Bonding material layers 2400 may act as a eutectic bonding material for a subsequent bonding process. Bonding material layer 2400 may or may not be electrically connected to conductive lines within cap wafer 2000.

Figure 24:
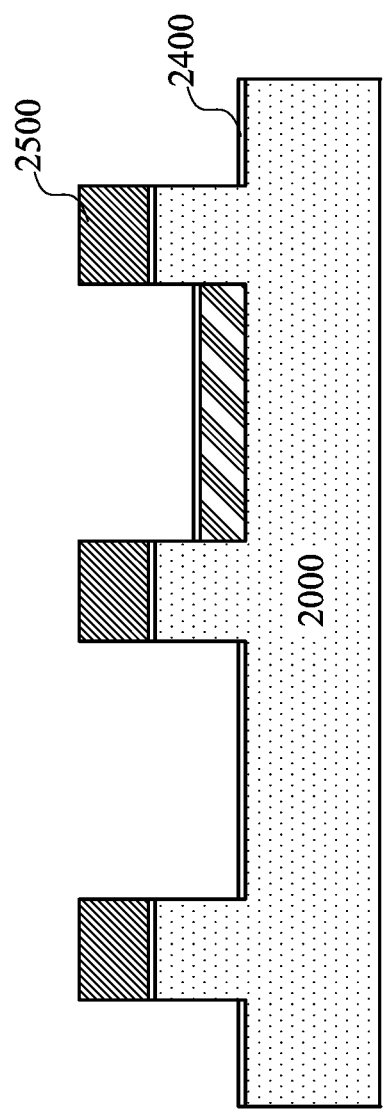
Figure 25:
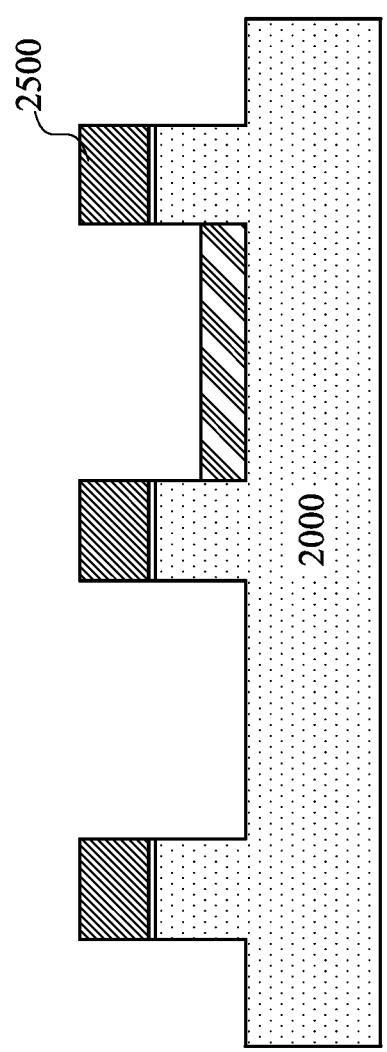
Figure 26:
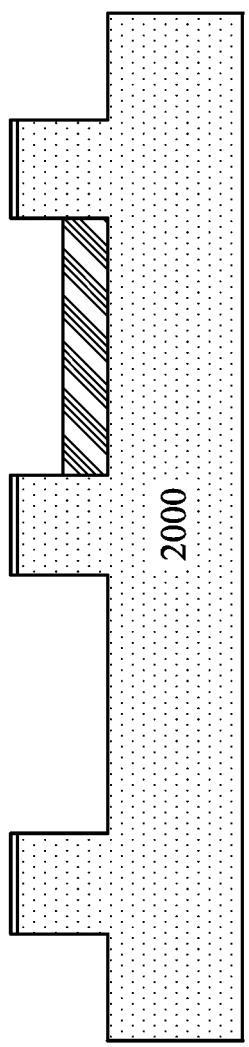

Next, referring to FIG. 24, photoresist layer 2500 is deposited over cap wafer 2000 and bonding material layer 2400. Photoresist layer 2500 is patterned to expose areas of bonding material layer 2400 that will not be used for bonding. Next, an etching process is performed to remove the areas of bonding material layer 2400 that will not be used for bonding. Any acceptable etching process may be used, such as a wet or dry etch. The resulting cap wafer 2000 is depicted in FIG. 25. Next, photoresist layer 2500 is removed. Photoresist layer 2500 may be removed through a process such as dissolving in chemical solution, plasma ashing or other means, whereby the temperature of photoresist layer 2500 is increased until photoresist layer 2500 decomposes and may be removed. The resulting cap wafer 2000 is depicted in FIG. 26.

Figure 27:
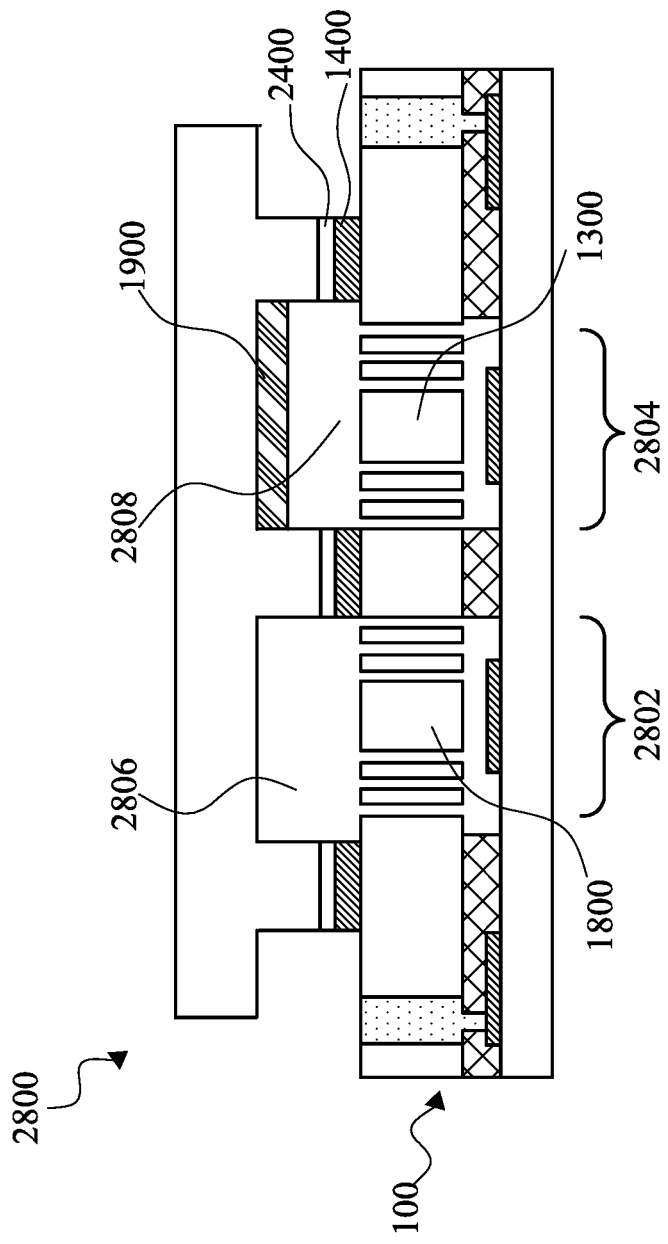

FIG. 27 illustrates a stacked MEMS chip 2800, wherein cap wafer 2000 is flipped and stacked over the structure 100. Cap wafer 2000 may be bonded to the structure 100 by eutectic bonding between the bonding material layers 2400 and contacts 1400. For example, in some embodiments a surface pre-treatment, as an etching process or a CVD process, may be performed on bonding material layers 2400 and contacts 1400. Cap wafer 2000 is then aligned with structure 100 so that bonding material layers 2400 match with contacts 1400. In some embodiments, a bonding force is applied to cap wafer 2000 and structure 100 to strengthen the bonding process. In some embodiments, a force from about 10 KN to about 100 KN, such as about 40 KN, may be applied. Cap wafer 2000 and structure 100 may be heated to a temperature to strengthen the bonding. In some embodiments, this temperature applied during the bonding is from about 400 degrees to about 500 degrees, such as about 450 degrees. In some embodiments, the eutectic bonding may occur in a pressurized chamber providing a pressured environment. In some embodiments, the pressure applied during bonding may be from about 1 mbar to about 300 mbar, such as about 10 mbar.

As shown in FIG. 27, through the eutectic bonding, movable mass 1800 is disposed in sealed cavity 2806, and movable mass 1300 is disposed in sealed cavity 2808. Further, out gas layer 1900 is disposed in sealed cavity 2808. The conditions under which the eutectic bonding is performed may dictate the pressure in cavity 2806 and the pressure in cavity 2808 after the eutectic bonding process. For example, if the eutectic bonding is performed in a vacuum chamber, then the pressure inside cavity 2806 and the pressure in cavity 2808 after the bonding may be at the pressure of the vacuum chamber. Similarly, if the eutectic bonding is performed at ambient pressure, then the pressure in cavity inside cavity 2806 and the pressure in cavity 2808 after the bonding may be at ambient pressure.

Next, referring to FIG. 28, MEMS chip 2800 is annealed to stimulate the out gassing from out gas layer 1900. For example, MEMS chip 2800 may be heated to a temperature. In some embodiments, in the case of out gas layer 1900 comprising FSG with a thickness of about 0.5 µm, to about 10 µm, such as about 2 µm. MEMS chip 2800 may be heated to a temperature in a range from of about 300 degrees to about 500 degrees, such as about 400 degrees. The annealing may cause out gassing into sealed cavity 2808 from out gas layer 1900. The out gassing from out gas layer 1900 may increase the pressure inside sealed cavity 2808. For example, the pressure in a chamber comprising a gas is proportional to the volume of gas in the chamber. By increasing the volume of gas in the chamber through the out gassing from out gas layer 1900, the pressure in sealed cavity 2808 is thereby increased. As discussed above, the pressure of cavity 2808 after the annealing and the out gassing from out gas layer 1900 may be controlled by controlling the composition of out gas layer 1900. In the case of the out gas layer 1900 comprising FSG, the out gassing may be increased by increasing the amount of fluorine in the FSG, which will increase the volume of out gassing of the out gas layer 1900.

FIG. 28 illustrates a completed MEMS chip 2800 in accordance with various embodiments. MEMS chip 2800 includes a gyroscope 2802. Gyroscope 2802 includes movable mass 1800 and sensor 104A disposed in sealed cavity 2806. The pressure of sealed cavity 2806 may be selected in accordance with the desired functionality of gyroscope 2802. In some embodiments, it may be preferable to have a low pressure in cavity 2806 for gyroscope 2802, which may help to increase the sensitivity and resolution of gyroscope 2802. The pressure of sealed cavity 2806 may be defined by the conditions of the eutectic bonding process between cap wafer 2000 and structure 100. For example, the eutectic bonding process may be performed in chamber having a certain pressure level to define an appropriate pressure level of the sealed cavities. For example, sealed cavity 2806 may have a pressure from about 1 mbar to about 1100 mbar, such as 1 mbar.

MEMS chip 2800 also contains an accelerometer 2804 that detects acceleration through the disposition of movable mass 1300 over accelerometer sensor 104B in sealed cavity 2808. In some embodiments, it may be preferable for the pressure of sealed cavity 2808 to be relatively higher than the pressure of sealed cavity 2806. For example, a higher pressure may enable accelerometer to have higher damping and increased reliability. The pressure of sealed cavity 2808 may be defined by both the conditions of the bonding process between cap wafer 2000 and structure 100 as well as the out gassing of out gas layer 1900. For example, as described above, the eutectic bonding process may be performed in chamber having a certain pressure level to define a pressure level of the sealed cavities. After the eutectic bonding process, sealed cavity 2808 may have the same pressure as sealed cavity 2806. After an annealing is performed, the pressure of sealed cavity 2808 is defined by the original pressure of sealed cavity 2808 plus the increased pressure created by the out gassing from out gas layer 1900. For example, after the annealing is performed, sealed cavity 2808 may have a pressure from about 1 mbar to about 1100 mbar, such as 1000 mbar.

Figure 29:
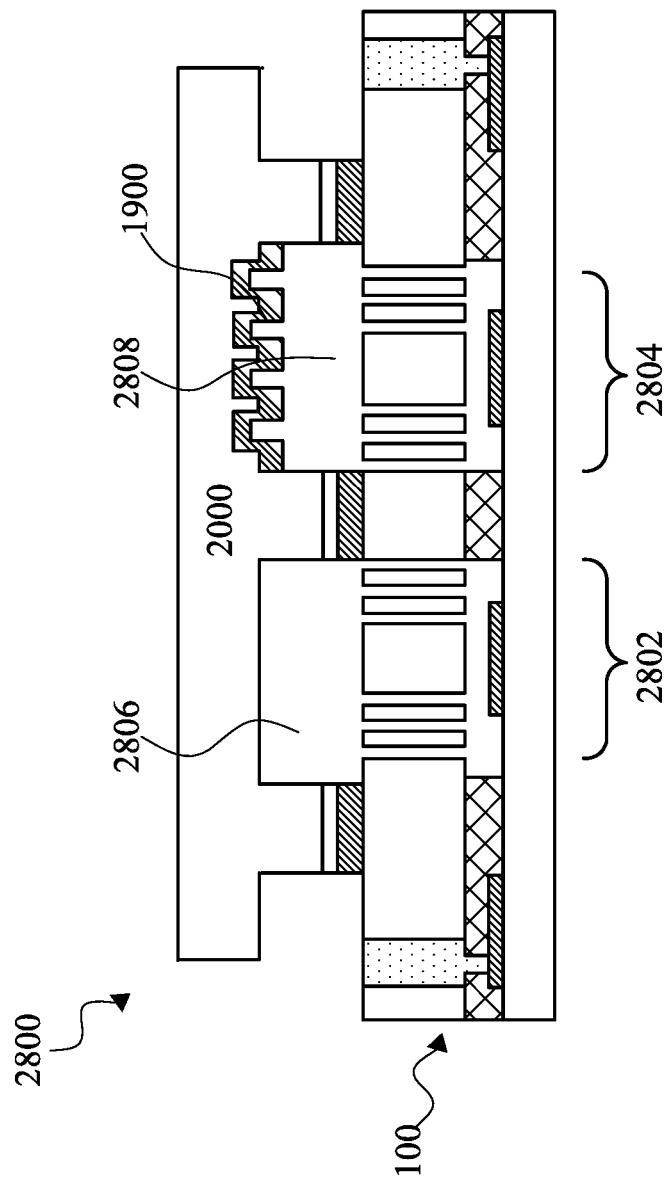
FIG. 29 is a cross sectional view of a MEMS device in accordance with various embodiments.

Other embodiments are possible. For example, FIG. 29 depicts embodiments of a MEMS device 2900, which is similar to the MEMS chip 2800 except that the out gas layer 1900 is formed over a grooved surface of cap wafer 2000. Details regarding this embodiment that are similar to those for the previously described embodiment will not be repeated herein.

For example the formation of this embodiment may include, before out gas layer 1900 is deposited over cap wafer 2000, cap wafer may be etched to form the grooved surface depicted in FIG. 29. Although extra processing steps may be required to form the grooved surface of cap wafer 2000 as shown in FIG. 29, the grooved surface may increase the surface area of out gas layer 1900 in sealed cavity 2808, which may decreased the time required for annealing and may increase the volume of out gas that is released during annealing. As such, the cap wafer 2000 of FIG. 29 may enable sealed cavity 2808 to achieve relatively higher pressure, if required according to the particular application and design.

Thus, using the various formation steps illustrated in FIGS. 1-29, MEMS chips are formed comprising a gyroscope and an accelerometer, each disposed in a respective sealed cavity that has a different pressure from the other respective sealed cavity. As described above, the first sealed cavity and the second sealed cavity are formed in the same bonding process in some embodiments. MEMS chips, such as MEMS chip 2800 and MEMS chip 2900, may be formed on a single chip and using the same MEMS manufacturing process with minimal additional cost.

According to certain embodiments, a method of forming a MEMS device is provided. The method includes depositing an out gas layer on a surface of a cap wafer. The cap wafer is bonded to a substrate in a manner that forms a first sealed cavity and a second sealed cavity. The first sealed cavity includes a first movable element and the second sealed cavity includes a second movable element. The out gas layer is annealed to release gas from the out gas layer into the second sealed cavity and increase a pressure of the second sealed cavity. The second sealed cavity has a higher pressure than the first sealed cavity after the annealing.

According to certain embodiments, a method of forming a MEMS device is provided. The method includes patterning a dielectric layer of a first substrate to expose conductive features and a bottom layer through the dielectric layer. The first substrate includes the dielectric layer and the bottom layer. The conductive features are disposed in the dielectric layer proximate to the bottom layer. A first surface of a second substrate is bonded to the dielectric layer. The second substrate is patterned to form a first movable element and a second movable element. A first plurality of metal bonds is formed on a second surface of the second substrate, the second surface being opposite the first surface. An out gas layer is deposited on a surface of a cap wafer. A second plurality of metal bonds is formed on the surface of the cap wafer. The cap wafer is bonded to the second substrate by bonding the second plurality of metal bonds to the first plurality of metal bonds. The bonding of the cap wafer to the second substrate forms a first sealed cavity including the first movable element and a second sealed cavity including the second movable element. The out gas layer is confined to the second sealed cavity. The out gas layer is annealed to release gas into the second sealed cavity from the out gas layer and increase a pressure of the second sealed cavity.

According to certain embodiments, a MEMS device is provided. The MEMS device includes a first substrate, the first substrate including a first conductive feature disposed in a first cavity. A first movable element is positioned over the first conductive feature. The first cavity has a first pressure. A second conductive feature is disposed in a second cavity, a second movable element positioned over the second conductive feature. The second cavity has a second pressure that is higher than the first pressure. A cap wafer is bonded to the first substrate, the cap wafer and the first substrate defining the first cavity and the second cavity. The cap wafer comprises an out gas layer that is confined to the second cavity.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a micro-electromechanical (MEMS) device, the method comprising:
    depositing an out gas layer on a cap wafer, wherein after the depositing the out gas layer extends along a recess of the cap wafer and along protrusions that define the recess of the cap wafer;
    removing portions of the out gas layer that extend along the protrusions;
    bonding the cap wafer to a substrate in a manner that forms a first sealed cavity comprising a first movable element and a second sealed cavity comprising a second movable element; and
    annealing the out gas layer to release gas from the out gas layer into the second sealed cavity and increase a pressure of the second sealed cavity, the second sealed cavity having a higher pressure than the first sealed cavity after the annealing.

2. The method of claim 1, wherein bonding the cap wafer to the substrate comprises a eutectic bonding process, wherein a pressure level of the first sealed cavity after the bonding is defined by the eutectic bonding process.

3. The method of claim 1, wherein the bonding comprises bonding a first plurality of metal bonds on the cap wafer to a second plurality of metal bonds on the substrate.

4. The method of claim 1, further comprising forming a through via that extends from a conductive feature in the substrate to a major surface of the substrate to which the cap wafer is bonded.

5. The method of claim 1, further comprising etching the cap wafer to form the recess and the protrusions.

6. The method of claim 1, wherein the bonding of the cap wafer to the substrate forms a gyroscope disposed in the first sealed cavity and an accelerometer disposed in the second sealed cavity.

7. The method of claim 1, further comprising etching the substrate to form the first movable element and the second movable element.

8. The method of claim 1, wherein after the annealing the first sealed cavity has a lower pressure than the second sealed cavity.

9. The method of claim 1, wherein the out gas layer extends only in the recess of the cap wafer, and wherein a surface of the cap wafer underlying the out gas layer is grooved.

10. A method for forming a micro-electromechanical (MEMS) device, the method comprising:
patterning a dielectric layer of a first substrate to expose conductive features and a bottom layer through the dielectric layer, the first substrate comprising the dielectric layer and the bottom layer, the conductive features being disposed on the bottom layer;
bonding a first surface of a second substrate to the dielectric layer;
patterning the second substrate to form a first movable element and a second movable element;
forming a first plurality of metal bonds on a second surface of the second substrate, wherein the second surface is opposite the first surface;
depositing an out gas layer on a surface of a cap wafer, wherein the out gas layer comprises fluorine;
forming a second plurality of metal bonds on the surface of the cap wafer;
bonding the cap wafer to the second substrate by bonding the second plurality of metal bonds to the first plurality of metal bonds, wherein bonding the cap wafer to the second substrate forms a first sealed cavity comprising the first movable element and a second sealed cavity comprising the second movable element, and wherein the out gas layer is confined to the second sealed cavity; and
annealing the out gas layer to release gas into the second sealed cavity from the out gas layer and increase a pressure of the second sealed cavity, wherein after the annealing the pressure of the second sealed cavity is greater than a pressure of the first sealed cavity.

11. The method of claim 10, wherein the pressure of the first sealed cavity is defined by a bonding process between the cap wafer and the second substrate.

12. The method of claim 10, wherein bonding the first surface of the second substrate to the dielectric layer comprises fusion bonding.

13. The method of claim 10, wherein after the annealing the pressure of the second sealed cavity is greater than the pressure of the first sealed cavity.

14. The method of claim 10, wherein the out gas layer is confined to a recess of the cap wafer, and wherein the surface of the cap wafer underlying the out gas layer is grooved.

15. A method, comprising:
bonding a second substrate to a first substrate, the first substrate comprising a plurality of conductors;
etching a cap layer to form a plurality of recesses in the cap layer;
forming an out gas layer in a first recess of the plurality of recesses that are etched in the cap layer;
bonding the cap layer to the second substrate, wherein the bonding of the cap layer to the second substrate creates a plurality of sealed cavities, each sealed cavity comprising a conductor of the plurality of conductors and each sealed cavity being defined in part by a recess of the plurality of recesses; and
annealing the out gas layer to release gas into a sealed cavity that is defined in part by the first recess, wherein after the annealing a pressure of the sealed cavity in which the gas is released is greater than a pressure of another sealed cavity of the plurality of sealed cavities.

16. The method according to claim 15, further comprising forming a plurality of through vias that extend through the second substrate.

17. The method according to claim 15, further comprising patterning the second substrate to form a plurality of movable elements, each of the plurality of movable elements being disposed in a sealed cavity of the plurality of sealed cavities after the bonding of the cap layer to the second substrate.

18. The method according to claim 15, wherein the cap layer is bonded to the second substrate using a eutectic bonding process.

19. The method according to claim 15, wherein a surface of the cap layer underlying the out gas layer is grooved.

20. The method according to claim 15, wherein a surface of the cap layer underlying the out gas layer is flat.

* * * * *